United States Patent [19]
Njinda et al.

[11] Patent Number: 5,596,585
[45] Date of Patent: Jan. 21, 1997

[54] PERFORMANCE DRIVEN BIST TECHNIQUE

[75] Inventors: Charles A. Njinda, San Jose; Neeraj Kaul, Milpitas, both of Calif.

[73] Assignee: Advanced Micro Devices, Inc., Sunnyvale, Calif.

[21] Appl. No.: 482,223

[22] Filed: Jun. 7, 1995

[51] Int. Cl.$^6$ .................................................. G01R 31/28
[52] U.S. Cl. ...................................... 371/22.5; 371/22.6
[58] Field of Search ................................... 371/22.5, 22.6, 371/22.1, 25.1; 324/158.1; 395/183.04

[56] References Cited

U.S. PATENT DOCUMENTS

| 5,056,094 | 10/1991 | Whetsel | 371/25.1 |
| 5,084,874 | 1/1992 | Whetsel, Jr. | 371/22.3 |
| 5,477,549 | 12/1995 | Kamagata et al. | 371/22.5 |

FOREIGN PATENT DOCUMENTS

| 0498191A1 | 8/1992 | European Pat. Off. . |
| 2221044 | 1/1990 | United Kingdom . |

OTHER PUBLICATIONS

Chakraborty et al., "Design for Testability for Path Delay Faults in Sequential Circuits", 30th ACM/IEEE Design Automation Conference, published Jun. 14, 1993.

*Primary Examiner*—Robert W. Beausoliel, Jr.
*Assistant Examiner*—Trinh L. Tu
*Attorney, Agent, or Firm*—Skjerven, Morrill, MacPherson, Franklin & Friel; William L. Paradice, III

[57] ABSTRACT

A methodology for selecting an optimal group of flip-flops in a circuit design to be converted into BIST elements is disclosed which minimizes the performance degradation resulting from such conversion. In accordance with the present invention, the additional timing delays introduced into the circuit design resulting from each conversion of a flip-flop into a BIST element is incorporated into the selection of those flip-flops to be converted such that only those flip-flops which may be converted without any resultant timing violations are deemed suitable for conversion. A minimum group of these "suitable" flip-flops which breaks all of the logic cycles in the circuit is then selected for BIST conversion. Thus, selection methodologies in accordance with the present invention not only simultaneously minimizes the increase in silicon area due to BIST conversion while maximizing fault coverage, but also results in minimal performance degradation.

6 Claims, 6 Drawing Sheets

PERFORMANCE DRIVEN BIST TECHNIQUE

FIELD OF THE INVENTION

The present invention relates to the testing of complex digital logic circuits and particularly to the testing of such circuits using built-in self test techniques.

BACKGROUND

Built-in self test (BIST) methodologies are currently used to diagnostically test the logic portions of an IC and typically provide fault coverage on the order of 98% or higher. In a typical partial scan BIST technique, such as that disclosed by A. Kraniewski and S. Pilarski in "Circular Self Test Path: A Low-Cost BIST Technique for VLSI Circuits", IEEE Trans. on CAD, Vol. 8, No. 1, pp. 46–55, January 1989 and incorporated by reference herein, selected ones of the storage elements contained within the target logic circuit are converted into scannable, or BIST, elements and connected together to form a "scan chain." A pattern generator such as pseudo random pattern generator (PRPG) or a weighted random pattern generator (WRPG) is used to provide random vectors as input signals into the scan chain. The resultant output signals generated by the scan chain and circuit outputs in response to the random input vectors are then received by a multiple input signature analyzer (MISR). Using these received output signals, the MISR generates a final value. Faults within the circuit are then detected by comparing this final value with simulation data. Storage elements are selected for conversion to BIST elements such that each logic cycle within the circuit design will be broken, i.e., each cycle will, after BIST conversion, contain at least one such BIST element.

FIG. 1 illustrates the resultant conversion of an ordinary D flip-flop 10 into a scannable or BIST element 12. A logic network including NAND gates 14, 16 and an exclusive OR gate 18 is connected to the input terminal of flip-flop 10. The original input signal D and a first BIST control signal B0 are inputs to NAND gate 14 while a scan input vector and a second BIST control signal B1 are inputs to NAND gate 16. BIST control signals B0 and B1 determine the operating mode of scannable flip-flop 12.

BIST architectures such as that described above are typically inserted into a logic with little or no consideration given to resultant performance degradations. When designing logic circuits, most designers do so such that all functional and timing requirements are initially satisfied and then rely on automatic test tools to insert BIST elements logic into the circuit. If timing delays attributable to BIST elements and logic are ignored, insertion of such BIST elements and logic can adversely affect the timing behavior of the critical paths of the circuit, thereby resulting in critical timing violations. A number of design iterations may be required in the design of the circuit to correct these resultant timing violations. Such iterations are, however, cumbersome and often ineffective since the circuit designer is typically not familiar with changes the circuit netlist resulting from the insertion of BIST elements and logic.

Other attempts to incorporate performance degradation into partial scan BIST methodologies involve statically specifying which flip-flops lie in a critical path before any BIST element insertion so that these "critical" flip-flops are not modified, i.e., converted into BIST elements. The modification of flip-flops not in a critical path may, however, render previously uncritical paths in the design critical, thereby creating a new set of critical flip-flops that, if modified, would result in timing violations. Furthermore, where a large proportion of flip-flops within the target circuit are deemed "critical" and thus not suitable for modification into BIST elements, there may not be enough remaining non-critical flip-flops suitable for such modification to ensure that all logic cycles are broken which, in turn, results in poor fault coverage.

Others so attempting to implement a performance-driven partial scan methodology factor in constant timing delays associated with the BIST elements and logic in determining which flip-flops are suitable to modify into BIST elements. For example, see J. Y. Jou and K. T. Cheng, "Timing-Driven Partial Scan", Proc. ICCAD, pp. 404–407, 1991). Such an approach, however, considers timing delays at the input of BIST elements; additional delays caused at the outputs of BIST elements are ignored. Like those approaches described above which statically exclude critical flip-flops from BIST conversion, that disclosed by Jou and Cheng fails to consider dynamic timing information of the circuit in computing accurate delays introduced by BIST elements and logic and, therefore, does not effectively minimize performance degradation due to the insertion of BIST architectures into a logic circuit.

Therefore what is needed is a partial scan BIST insertion technique that, in addition to minimizing the increase in silicon area and optimizing the fault coverage, dynamically predicts the performance degradation of a circuit resulting from the conversion of storage elements into BIST elements.

SUMMARY

A methodology for selecting an optimal group of flip-flops in a circuit design to be converted into BIST elements is disclosed which minimizes the performance degradation resulting from such conversion. In accordance with the present invention, the additional timing delays introduced into the circuit design resulting from each conversion of a flip-flop into a BIST element is incorporated into the selection of those flip-flops to be converted such that only those flip-flops which may be converted without any resultant timing violations are deemed suitable for conversion. A minimum group of these "suitable" flip-flops which breaks all of the logic cycles in the circuit is then selected for BIST conversion. Thus, selection methodologies in accordance with the present invention not only simultaneously minimize the increase in silicon area due to BIST conversion while maximizing fault coverage, but also result in minimal performance degradation.

DETAILED DESCRIPTION

Before selecting those storage elements in a circuit design which are to be converted into BIST elements in accordance with the present invention, an appropriate BIST architecture is selected. If the circuit design has boundary scan registers, or if random logic blocks are surrounded by such registers, these registers may be modified to serve as a PRPG, for the input test structure, and a MISR for the output test structure. This allows for the elimination of the dedicated PRPG and MISR structures, thereby saving die area. Where the design circuit includes embedded structures such as RAMs, ROMs, PLAs, and so on, which are typically tested using a separate BIST methodology, bypass logic must be inserted or modelling techniques used so that any logic that drives or is driven by such embedded structures can be separately tested (and are thus not included in the scan chain formed by the converted BIST elements).

As mentioned previously, in order to obtain optimal fault coverage while conserving silicon area, a minimum number of flip-flops should be selected for BIST conversion such that all logic cycles are broken. Furthermore, in order to minimize performance degradation resulting from BIST conversion, the effect of each such conversion upon the timing delays of each logic cycle associated thereto must be considered during, and thus factored into, the flip-flop selection process.

Figure 1:
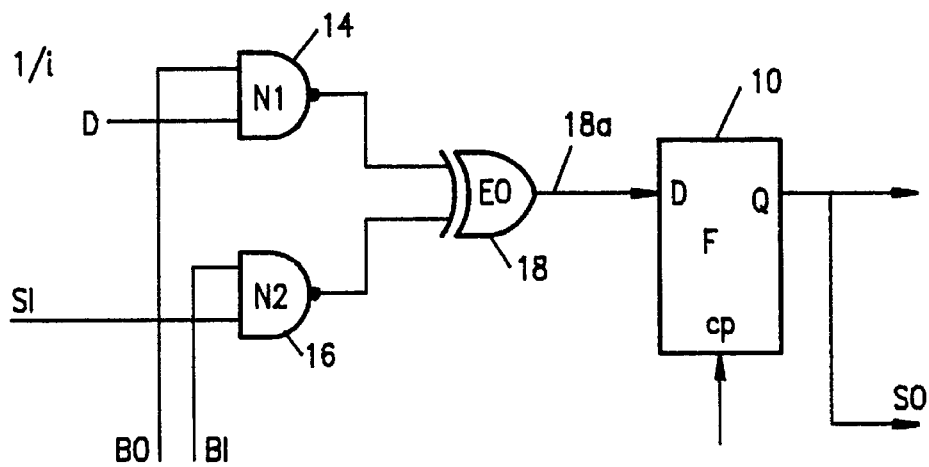
FIG. 1 is a schematic diagram illustrating the conversion of a flip-flop into a BIST element.
Figure 2:
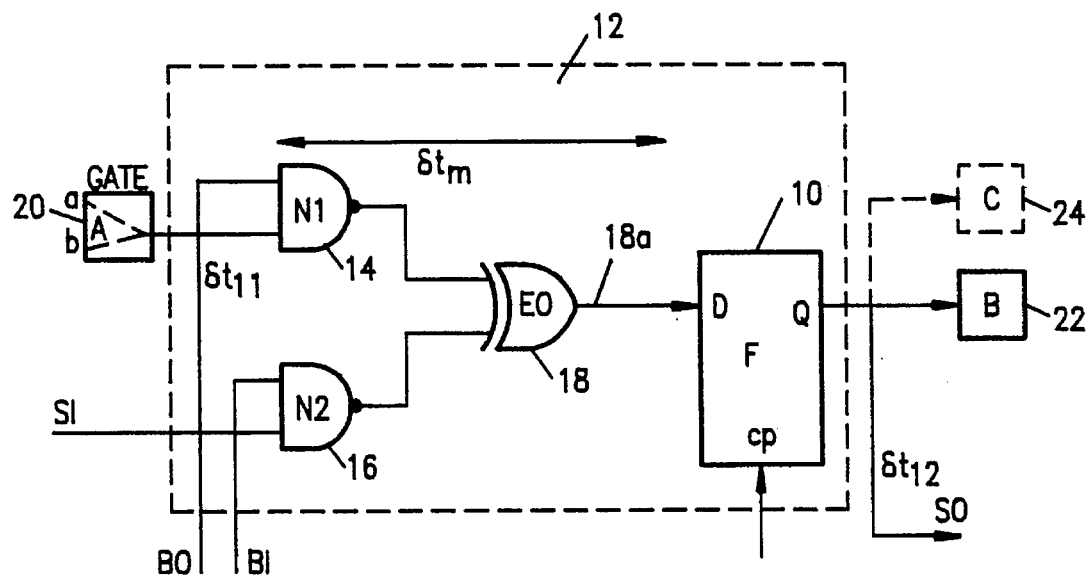
FIG. 2 is a schematic diagram illustrating the various timing delays introduced by the BIST conversion shown in FIG. 1.

FIG. 2 illustrates the additional timing delays introduced into a target circuit (not shown) when a flip-flop 10 is converted into BIST element 12 of FIG. 1. Before the addition of BIST logic 14, 16, 18, gate 20 drove the data input of flip-flop 10 which, in turn, drove gates 22, 24. Gates 20, 22, 24 represent logic connected to flip-flop 10 and in actual embodiments may contain NAND, NOR, XOR, or any other suitable logic elements.

After BIST modification, i.e., after the insertion of BIST logic 14, 16, 18, gate 20 drives an input of NAND gate 14 of BIST element 12, flip-flop 10, in addition to driving gates 22, 24, now must also drive the next BIST element in the scan chain (not shown), as indicated by the output signal SO ("scan out"). The timing delays associated with the BIST conversion of flip-flop 10 are modeled by parameters $\delta t_m$, $\delta t_{11}$ and $\delta t_{12}$, as shown in FIG. 2 and as described below.

$\delta t_m$ may be expressed as $f^1 (t_m, l_m, s_m)$, where $t_m$ is a constant which represents the sum of delays of NAND gate 14 and XOR gate 18, $s_m$ is the slew rate at the output of gate 20 which varies with the drive and load characteristics of gate 20, and $l_m$ is the loading effect on XOR gate 18 due to the input of flip-flop 10 and wire 18a. It is to be noted that parameters $s_m$ and $l_m$ may vary greatly among circuit components. For instance, in modern deep submicron technologies, a small variation in slew rate $s_m$ can result in a 50% change in resultant delay. Further, since many types of flip-flops may be used in a particular design, $l_m$ may be of different values at various parts of the circuit.

$\delta t_{11}$ may be expressed as $f^2(\delta l_a)$, where $\delta l_a$ is the change in delay resulting from changing the loading of gate 20 (e.g. from flip-flop 10 to NAND gate 14). This change in delay depends on the particular driving characteristics of gate 20 and, thus, may vary between BIST elements 12 contained in the target logic circuit (not shown).

$\delta t_{12}$ may be expressed as $=f^3(\delta l_F)$, where $\delta l_F$ is the change in loading of flip-flop 10 resulting from the fanout of the next BIST element 12 in the scan chain (not shown). Since the signal SO of a prior BIST element will be coupled to an input of a NAND gate 16 of the next BIST element 12 in the scan chain, this fanout includes loading effects on flip-flop 10 due to such NAND gate. This fanout is also influenced by the drive characteristics of output Q of flip-flop 10. Further, this additional loading of flip-flop 10 degrades the slew rate at output Q which, in turn, increases the delay at the inputs of gates 22, 24. The functions $f^1$, $f^2$ and $f^3$ are arbitrary and in actual embodiments will depend upon the particular delay models employed by the source foundries. Accordingly, the discrete delay analysis described above is not limited to any particular delay model.

The additional delays associated with the conversion of each flip-flop into a BIST element will affect the timing delays associated with the succeeding logic element, the delays associated with those two elements will affect the succeeding logic element, and so on. Thus, since the additional delays resulting from BIST conversion are cumulative through a particular logic path, these delays must be dynamically considered.

It follows that after a flip-flop has been converted to a BIST element, the delay at the input of that BIST element, and thus the delay associated with each logic path terminating in that BIST element, is increased by an amount $\delta t_e = \delta t_{11} + \delta t_m$. This amount $\delta t_e$ is hereinafter referred to as the in-delay of a BIST element. Similarly, the delay at the output of such a BIST element, and thus the delay associated with each logic path originating from the BIST element, is increased by the above-defined amount $\delta t_{12}$. The new delay at the output of the BIST element is hereinafter referred to as the out-delay.

The cumulative delay of each timing path originating from a particular BIST element may be expressed as $d_b = d_a + \delta t_{12}$, where $d_b$ is the delay of the logic path before BIST conversion, $d_a$ is the delay of the logic path after BIST conversion, and $\delta t_{12}$ is the out-delay the BIST element. Similarly, the cumulative delay of each logic path terminating at a particular BIST element may be expressed as $d_a = d_b + \delta t_e$, where $d_b$ is the delay of the logic path before BIST conversion, $d_a$ is the delay of the timing path after BIST conversion, and $\delta t_e$ is the in-delay of the BIST element. It should be noted that where a timing path originates from and ends in BIST elements, appropriate delays must be added to both the beginning and the end of the path. Accordingly, the delay of such a path may be expressed as $d_a = d_b + \delta t_{12,FF1} + \delta t_{e,FF2}$, where $\delta t_{12,FF1}$ is the out-delay of the BIST element at the origin of the logic path and $\delta t_{e,FF2}$ is the in-delay of the BIST element at the end of the logic path.

The delays added to each logic path resulting from the conversion of a flip-flop into a BIST element, as described above, should not cause any timing violations on that path. Thus, it is necessary to first ascertain the maximum delay of each path which would not result in timing violations. As long as those delays added to a path resulting from a BIST conversion are less than the slack of the path, i.e., the difference between this maximum delay and the actual delay of the path, that BIST conversion will not cause timing violations and thus will not degrade performance of the circuit.

The slack at the input of a flip-flop, often referred to as in-slack, is determined by the least of slacks in those logic paths terminating in the flip-flop. For instance, referring to FIG. 3, where blocks 30 and 32 represent logic functions, the slack at the input of $FF_4$ is equal to the least of the slacks associated with logic paths $P_{1,4}$, $P_{2,4}$, $P_{3,4}$. Thus, where a flip-flop has an in-slack of $t_1$, the delay in each path terminating at the flip-flop may be increased by $t_1$ without causing any timing violations.

Figure 3:
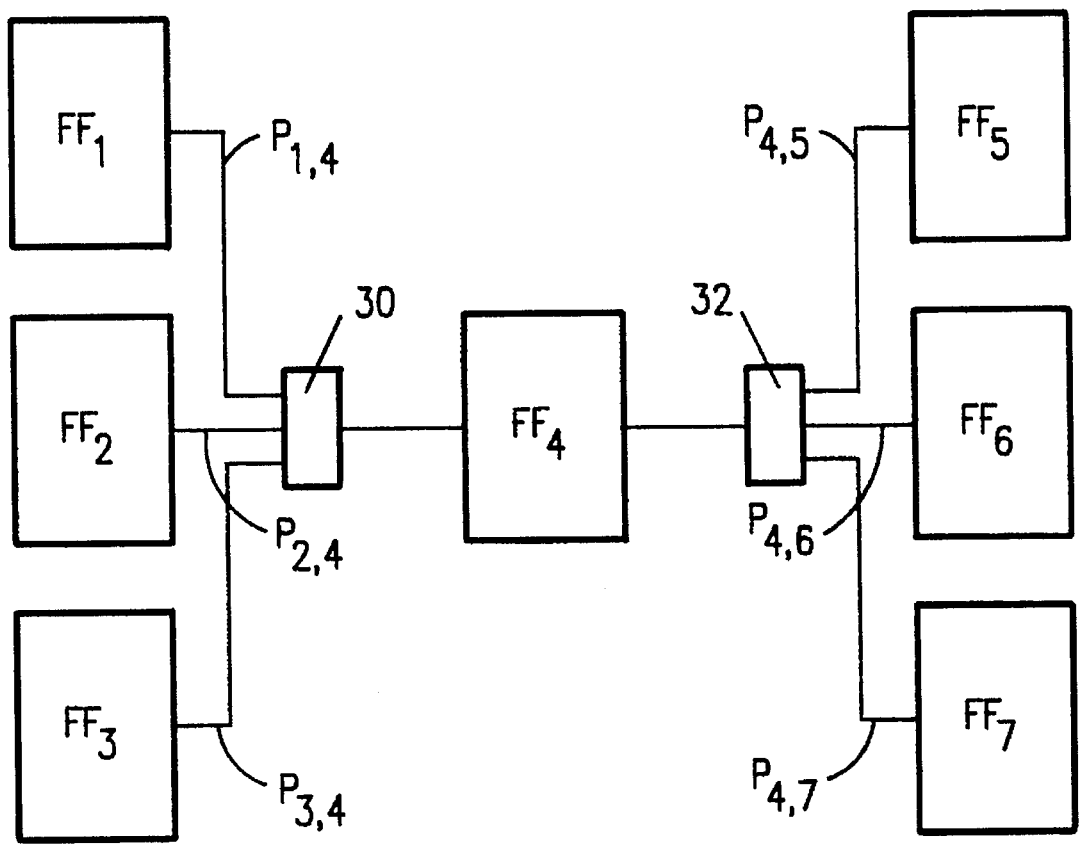
FIG. 3 is a schematic diagram illustrating dynamic changes in the in-slack and out-slack of a flip-flop due to BIST conversion.
Figure 4A:
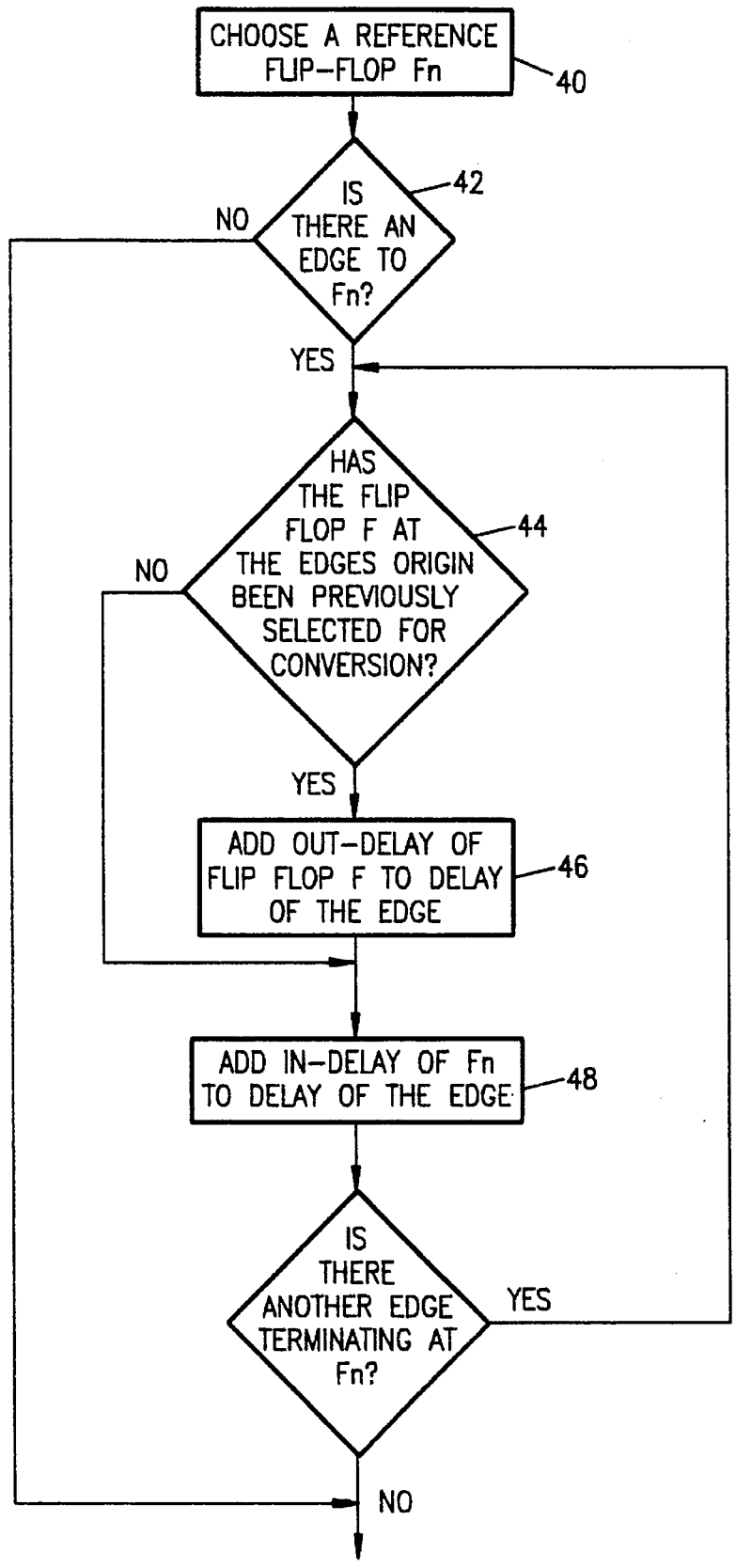
FIGS. 4a–4d are a flow chart illustrating a flip-flop selection method in accordance with the present invention.
Figure 4B:
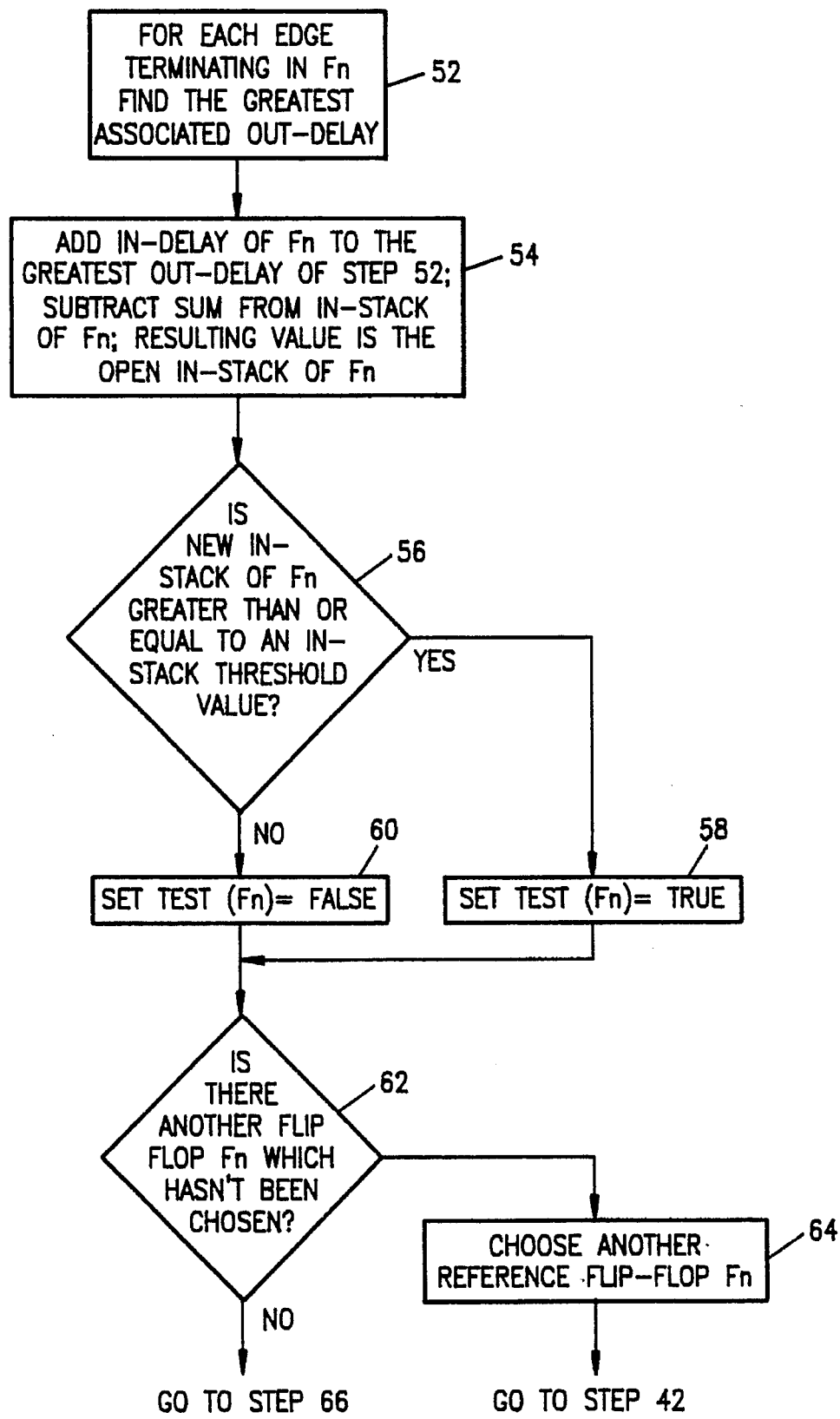
Figure 4C:
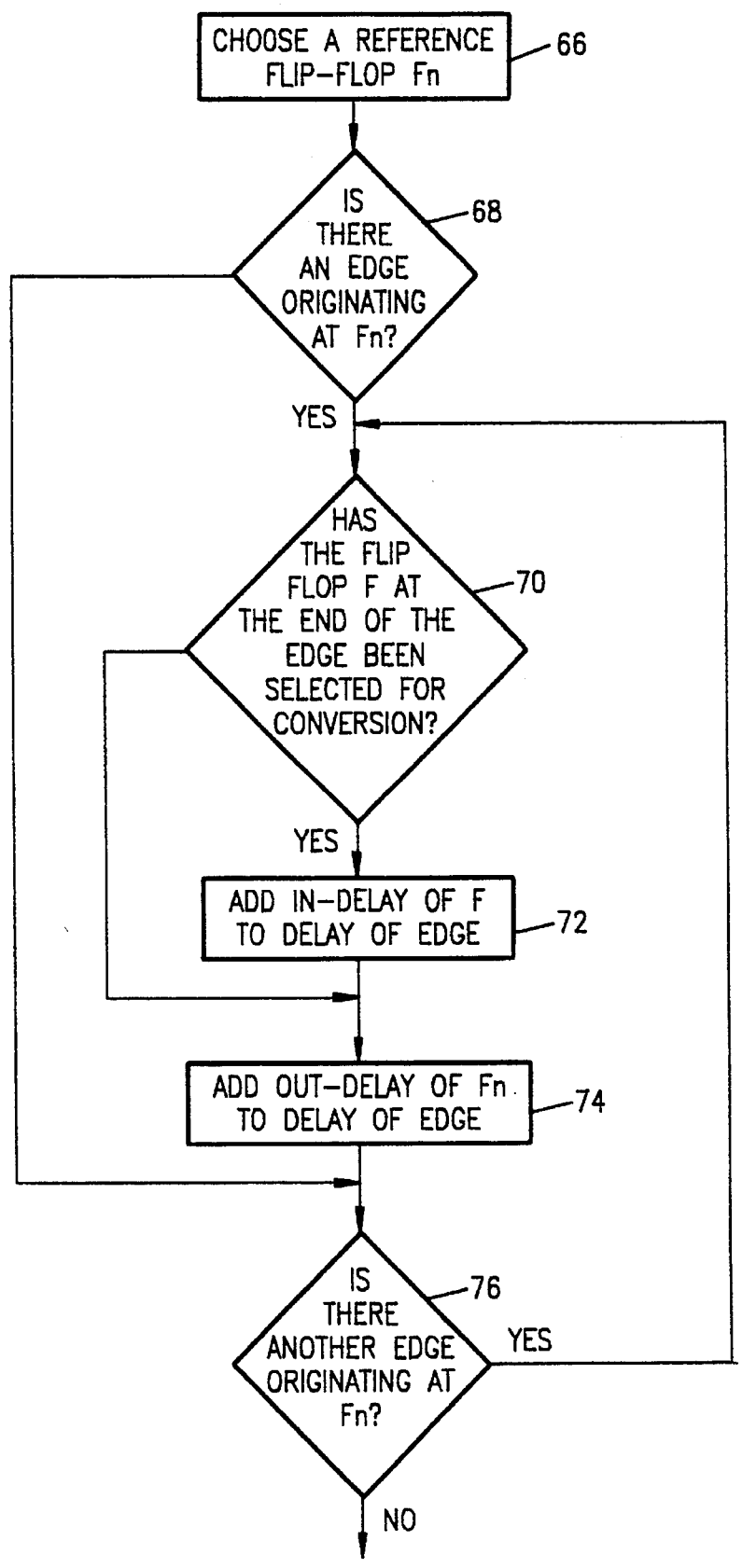
Figure 4D:
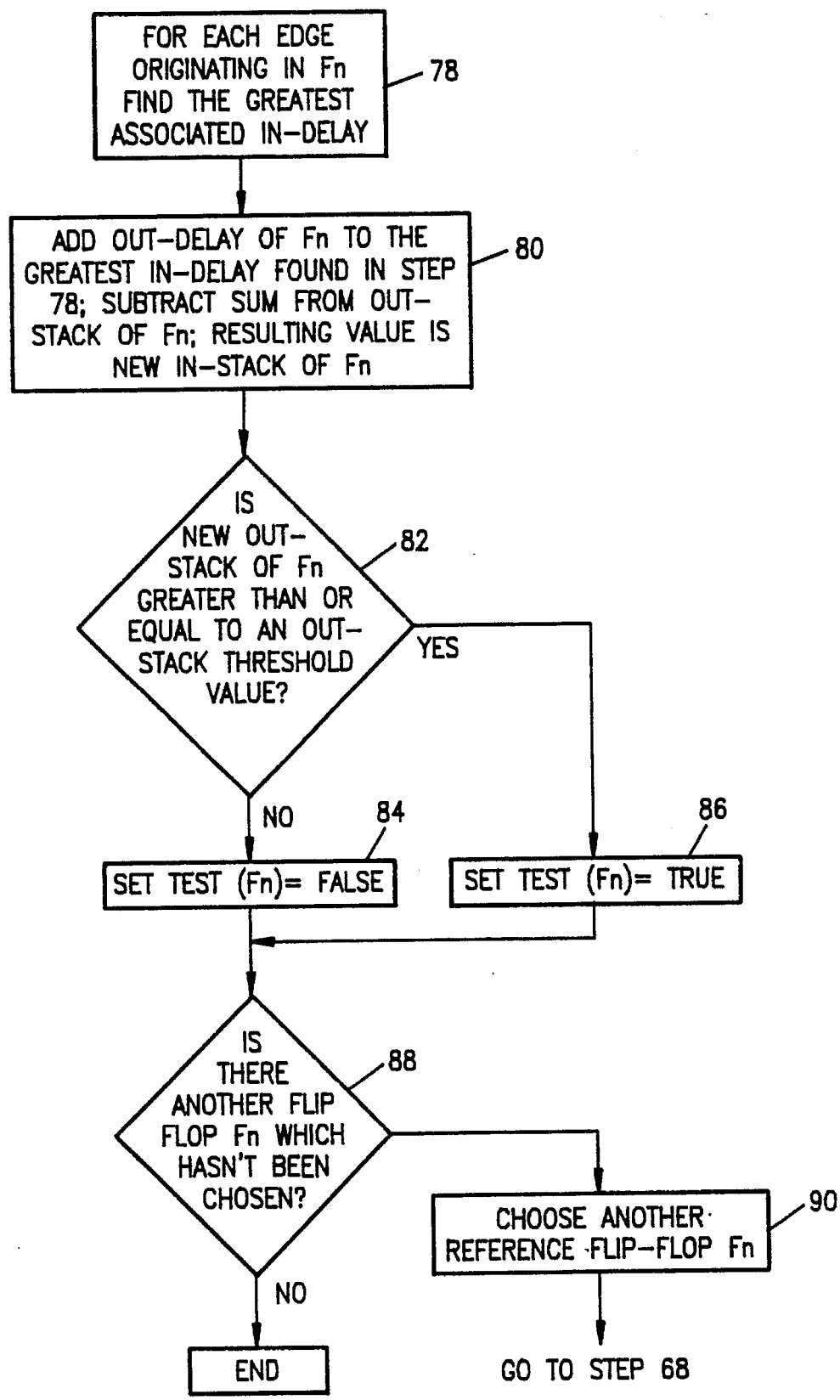

In a similar manner, the slack at the output of a flip-flop is called the out-slack and is determined by the least of slacks in those logic paths originating at the flip-flop. Referring to FIG. 3, the out-slack of flip-flop $FF_4$ is equal to the least of the slacks associated with logic paths $P_{4,5}$, $P_{4,6}$, $P_{4,7}$. Accordingly, where a flip-flop has an out-slack=$t_1$, the delay of each path originating at the flip-flop may be increased by $t_1$ without causing any timing violations. The out-slacks, as well as the in-slacks, of each flip-flop may be easily determined using well known conventional static timing analysis techniques.

The selection of flip-flops in accordance with the present invention will now be described with reference to the flow chart illustrated in FIGS. 4a–d. First, the change in the in-slack of each flip-flop resulting from the previous selection of flip-flops to be converted into BIST elements is determined. Starting with a reference flip-flop $F_n$ in the target design (step 40), all other flip-flops $F$ having an edge to flip-flop $F_n$, that is, all flip-flops $F$ which lie at the origin of a path terminating in flip-flop $F_n$ (sometimes referred to as origin elements), are polled to determine which of these other flip-flops $F$ have already been selected for conversion to BIST elements (steps 42, 44, 50). For each flip-flop $F$ already selected for BIST conversion, the in-delay of flip-flop $F_n$ and the out-delay of the flip-flop $F$ are added to the timing path extending between the flip-flop $F$ and the reference flip-flop $F_n$ (steps 46, 48). For each of those flip-flops $F$ not already so selected, the delay of the corresponding timing path extending between the flip-flop $F$ and reference flip-flop $F_n$ is increased by only the in-delay of flip-flop $F_n$ (step 48). The resultant in-slack for flip-flop $F_n$, denoted as new-inslack($F_n$), is equal to the difference between in-slack($F_n$) and the sum of (1) in-delay($F_n$) and (2) the greatest of the out-delays corresponding to flip-flops $F$ (steps 52, 54). The value new-in-slack($F_n$) is then compared with a predetermined in-slack threshold value (step 56). If new-in-slack($F_n$) is greater than or equal to the in-slack threshold value, then flip-flop $F_n$ remains suitable for BIST conversion (step 58). Otherwise, flip-flop $F_n$ will not be considered for conversion (step 60). This process is then repeated for each flip-flop $F$ in the design (steps 62, 64).

For instance, taking flip-flop $F_4$ of FIG. 3 as the reference flip-flop $F_n$, it is first ascertained whether any of flip-flops $F_1$–$F_3$ have been selected for BIST conversion. Assuming that flip-flops $F_1$ and $F_2$ have been selected and flip-flop $F_3$ has not, the resultant in-slack for flip-flop $F_4$, new-in-slack($F_4$), will be equal to the difference between in-slack($F_4$) and the sum of in-delay($F_4$) and the greater of out-delay($F_1$) and out-delay($F_2$). If new-in-slack($F_4$) is greater than or equal to the in-slack threshold value, flip-flop $F_4$ remains suitable for BIST conversion. If not, flip-flop $F_4$ will not be selected for conversion.

Second, the change in the out-slack of each flip-flop resulting from the previous selection of flip-flops to be converted into BIST elements is determined. Again, starting with any reference flip-flop $F_n$ (step 66), each flip-flop $F$ to which an edge extends from flip-flop $F_n$ (e.g., a termination element) is polled to determine whether any one of flip-flops $F$ has been previously selected for BIST conversion (steps 68, 70, 76). For each flip-flop $F$ already selected for BIST conversion, the out-delay of flip-flop $F_n$ and the in-delay of the flip-flop $F$ are added to the timing path extending between the reference flip-flop $F_n$ and flip-flop $F$ (steps 72, 74). For each of those flip-flops $F_m$ not already so selected, the delay of the corresponding timing path extending between the reference flip-flop $F_n$ and flip-flop $F$ is increased by out-delay($F_n$) (step 74). The resultant out-slack for flip-flop $F_n$, denoted as new-out-slack($F_n$), is equal to the difference between out-slack($F_n$) and the sum of (1) out-delay($F_n$) and (2) the greatest of the out-delays corresponding to flip-flops $F$ (steps 78, 80). The value new-out-slack($F_n$) is then compared with a predetermined out-slack threshold value (step 82). If new-out-slack($F_n$) is greater than or equal to the out-slack threshold value, then flip-flip $F_n$ remains suitable for BIST conversion (step 84). Otherwise, flip-flop $F_n$ will not be selected for conversion (step 86). This process is then repeated for each flip-flop $F$ in the target circuit (step 88, 90).

Where the new-in-slack($F_n$) and new-out-slack($F_n$) of a flip-flop $F_n$ are greater than or equal to the in-slack and out-slack threshold values, respectively, that flip-flop $F_n$ may be converted to a BIST element without causing any timing violations in the logic circuit and, thus, each such flip-flop $F_n$ becomes a candidate for BIST conversion.

A bolean set TEST(F) is defined to hold either a "true" or "false" value for each flip-flop $F$ in the design. For those flip-flops $F$ deemed to be candidates, corresponding members of the bolean set TEST(F) are set to true. Conversely, for those flip-flops $F$ which are not candidates, corresponding members of the bolean set TEST(F) are set to false. For example, if it is determined, as described above, that flip-flop $F_2$ of FIG. 3 may be converted to a BIST element with no resultant timing violations, i.e., flip-flop $F_2$ is a candidate for BIST conversion, then TEST($F_2$) is set to true. If not, then TEST($F_2$) is set to false.

The above described methodology thus, in considering the effect BIST conversion may have upon the in-slack and out-slack of each flip-flop, ensures that BIST conversion will result in a minimum number of timing violations. Accordingly, performance degradation resulting from the insertion of a BIST architecture into a logic circuit is minimized.

In order to minimize the increase in silicon area required for BIST conversion while providing maximum fault coverage, only certain ones of those "candidate flip-flops" are selected for BIST conversion. As mentioned earlier, in order to provide adequate fault coverage, all logic cycles should be broken, i.e., at least one flip-flop in each cycle should be converted into a BIST element. Accordingly, it is necessary to find a minimal group of flip-flops such that each and every cycle of the circuit design passes through at least one of the flip-flops in that group. Note that the circuit designer may specify the minimal length of cycles to be considered. For instance, where a cycle length of 3 is chosen, cycles having a length equal to or less than 3 will not be considered.

As a first step, all of those flip-flops which are (1) contained in at least one logic cycle and (2) deemed to be candidates for BIST conversion as described above, i.e., those flip-flops having an associated TEST(F) value of true are grouped into a set Candidate_FF. All logic cycles in the design are identified and grouped into a set C. For each flip-flop $F_i$ in the design, a corresponding set $S(F_i)$ is defined as those cycles in C which include flip-flop $F_i$. Next, the flip-flop $F_i$ within the set Candidate_FF which is contained in the greatest number of cycles, i.e., that flip-flop $F_i$ for which its associated set $S(F_i)$ contains the greatest number of elements e.g. cycles, is selected for BIST conversion. Thus, all cycles which contain flip-flop $F_i$, i.e., those cycles contained in set $S(F_i)$, will be broken. These cycles are then removed from the set C such that C will contain only unbroken cycles. Flip-flop $F_i$ is removed from the set Candidate_FF such that Candidate_FF will contain only flip-flops which have not been selected for BIST conversion. For each flip-flop $F_j$ remaining in the set Candidate_FF, the cycles broken by the conversion of flip-flop $F_i$ are removed from the corresponding set of cycles containing that flip-flop $F_j$. In other words, for each flip-flop $F_j$, the set $S(F_i)$ is subtracted from set $S(F_j)$ (corresponding to flip-flop $F_j$) such that all sets S(F) will contain only unbroken cycles. This process is repeated until all cycles in the design are broken.

Where a logic circuit contains an exponentially large number of logic cycles, such as those circuits having associated therewith a clique circuit graph, the identification of all logic cycles (i.e., the construction of the set C described above) may be unacceptably slow. Thus, in another embodiment in accordance with the present invention, the speed of the cycle identification process may be increased by combining the cycles identification process with the BIST element selection process. That is, rather than breaking cycles (i.e., selecting flip-flops for BIST conversion) only after all cycles have been identified, cycles are broken after a predetermined number N of cycles of have been identified. Breaking cycles simultaneously with the incremental identification of cycles in such a manner is advantageous since the breaking of some of those first group of identified cycles N will invariably result in breaking other cycles which have not yet been identified, thereby increasing the speed of BIST selection process by eliminating such cycles from further analysis.

Applicants have found that such an approach may increase by orders of magnitude the speed of the BIST selection process of circuits having a large number of cycles. The predetermined value of N involves a balancing of speed and an optimal selection flip-flops to be converted. Speed may be maximized where N is small relative to the number of cycles in the circuit; the selection of flip-flops is optimized for values of N large relative to the total number of cycles in the circuit.

The changes in circuit layout resulting from the above described process are then incorporated into the circuit design, i.e., the design is changed to reflect the BIST conversion of selected flip-flops, the addition of BIST control circuitry, input PRPGs and output MISR, and so on. After this "modified" circuit is fabricated, it may be tested using any suitable well known BIST testing equipment.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

EXPERIMENTAL RESULTS

The methodologies described above in accordance with the present invention were implemented on various synthesized circuits and compared to one another and to conventional selection methodologies. The methodologies implemented are as follows:

ALL: In accordance with one embodiment of the present invention, this methodology selects, from those flip-flops that have sufficient in-slack and out-slack (i.e., TEST($F_i$) is TRUE), the flip-flops that break the most cycles for BIST conversion. If none of the flip-flops have sufficient in-slack and out-slack, this methodology defaults to the CYCL_ONLY methodology described below.

SLACK_ONLY: In accordance with another embodiment of the present invention, this methodology selects any flip-flop which has sufficient in-slack and out-slack. Where none of the flip-flops have sufficient in-slack and out-slack, the selection is made at random. Here, although the final design (after BIST conversion) may result in timing violations, such timing violations are kept to a minimum.

CYCLE_ONLY: This methodology selects the flip-flops which break most cycles. In-slack and out-slack are not considered.

NONE: Here, the flip-flops are selected at random.

Note that in certain cases it is useful to maintain cycles of a particular length N and break only those cycles which are of a length greater than N. For near acyclic circuits, where self loops need not be broken, the value of N should be 1. In comparing the above described methodologies using various circuit designs, different values of N were used in order to determine its effect on fault coverage and performance degradation. The circuits tested as described below were designed to have no timing violations before BIST conversion.

The first circuit tested was a pipelined ALU chip. The result of the test are shown below in Table 1. Full scan BIST, which selects all flip-flops, causes the largest number of timing violations. Using the SLACK_ONLY methodology reduces the timing violations to zero, which indicates that each cycle in the circuit contains at least one flip-flop that, if converted, would result in no timing violations. Although using the CYCL_ONLY results in a timing violation count of 7, the number of flip-flops selected chosen is kept to a minimum. Using the ALL heuristic again reduces the violation count to 0. In case the flip-flops were chosen randomly, as in heuristic NONE, the violation count is 8.

It should be noted that the CYCL_ONLY methodology selects a greater number of flip-flops for conversion than does the SLACK_ONLY methodology. This discrepancy results from the sub-optimal nature of the selection technique described above. If it is desired to convert a fewer number of flip-flops, a more accurate conventional technique may such as that disclosed by R. Rudell and A Sangiovanni-Vincentelli in "Multiple-valued Optimization for PLA Optimization", IEEE Trans. on CAD, Vol. CAD 6, pp. 727–750, Sept. 1987, may be employed. Since the number of flip-flops converted to BIST elements is proportional to the increase in silicon area required for BIST conversion, using full-scan BIST results in the greatest increase in overhead while using either the ALL or CYCL_ONLY methodology minimizes the overhead.

Another important result evident from the results of Table 1 is the effect of creating a near-acyclic BIST circuit. For the ALU circuit, increasing the value of N from 0 to 1 reduces the number of flip-flops selected for conversion without any change in the number of timing violations for any of the tested methodologies. Therefore, in such a circuit, the value of N should be 1, i.e., not all cycles need to be broken.

TABLE 1

| Results for Circuit 1 (alu) | | | | | |
|---|---|---|---|---|---|
| N | Heuristic | # FF's Selected | # Violations | # BIST Vectors | BIST Coverage |
| — | Full Scan | ALL | 44 | 151 | 97.83 |
| 0 | SLACK_ONLY | 15 | 0 | 195 | 96.06 |
| 0 | CYCL_ONLY | 16 | 7 | 198 | 95.09 |
| 0 | ALL | 15 | 0 | 195 | 96.05 |
| 0 | NONE | 20 | 8 | 201 | 96.43 |
| 1 | SLACK_ONLY | 8 | 0 | 226 | 94.74 |
| 1 | CYCL_ONLY | 8 | 7 | 278 | 96.74 |
| 1 | ALL | 8 | 0 | 278 | 96.02 |
| 1 | NONE | 12 | 8 | 301 | 96.01 |

Table 2 shows the results for a typical "poly" circuit, e.g., a circuit that computes polynomials. It can be seen that, for this poly circuit, all cycles cannot be broken without violating timing, e.g., there are some cycles that do not contain any flip-flops which can be converted without any resultant timing violations. For such a cycle, the determination of which methodology to use involves a balancing of minimizing timing violations and maximizing fault overage. The ALL and SLACK_ONLY methodologies, which break all cycles and thus ensure maximum coverage, were compared to modified methodologies ALL' and SLACK_ONLY' which do not break those cycles which would result in timing violations. Therefore, the ALL' and SLACK_ONLY' methodologies minimize performance degradations. In some cases, however, fault coverage may be comprised using the ALL' and SLACK_ONLY' methodologies. For the poly circuit tested, using the modified ALL' and SLACK_ONLY' methodologies significantly reduced timing violation without sacrificing fault coverage.

TABLE 2

Results for circuit 2 (poly)

| N | Heuristic | # FF's Selected | # Violations | # BIST Vectors | BIST Coverage |
|---|---|---|---|---|---|
| — | Full Scan | 128 | 166 | 891 | 99.94 |
| 0 | ALL' | 17 | 0 | 770 | 99.95 |
| 0 | ALL | 32 | 32 | 398 | 99.96 |
| 0 | SLACK_ONLY' | 31 | 0 | 410 | 99.96 |
| 0 | SLACK_ONLY | 32 | 32 | 398 | 99.96 |
| 0 | CYCL_ONLY | 32 | 32 | 398 | 99.96 |
| 0 | NONE | 32 | 32 | 398 | 99.96 |
| 1 | ALL' | 17 | 0 | 891 | 99.95 |
| 1 | ALL | 32 | 25 | 517 | 99.96 |
| 1 | SLACK_ONLY' | 31 | 0 | 385 | 99.94 |
| 1 | SLACK_ONLY | 46 | 25 | 749 | 99.96 |
| 1 | CYCL_ONLY | 18 | 23 | 384 | 99.95 |
| 1 | NONE | 45 | 28 | 657 | 99.96 |
| 2 | ALL | 17 | 0 | 760 | 99.95 |
| 2 | SLACK_ONLY | 32 | 0 | 919 | 99.96 |
| 2 | CYCL_ONLY | 18 | 23 | 384 | 99.95 |
| 2 | NONE | 31 | 18 | 650 | 99.96 |

Table 3 shows the results for a Hopfield Network in which every flip-flop is in at least one distinct loop. Thus, since all flip-flops must be chosen for BIST conversion in such a circuit, the choice of methodologies is largely trivial. Only the value of N has a significant effect upon fault coverage and timing violations. For a near acyclic circuit, i.e. N=1, we there is a reduction in both timing violations and overhead as compared to that where N=0. Choosing N=2 further reduces overhead and timing violations. However, note that as N is increased the fault coverage decreases.

TABLE 3

Results for circuit 3 (Hopfield)

| N | Heuristic | # FF's Selected | # Violations | # BIST Vectors | BIST Coverage |
|---|---|---|---|---|---|
| — | Full Scan | 32 | 88 | 156 | 99.49 |
| 0 | SLACK_ONLY | 32 | 88 | 156 | 99.49 |
| 0 | CYCL_ONLY | 32 | 88 | 156 | 99.49 |
| 0 | ALL | 32 | 88 | 156 | 99.49 |
| 0 | NONE | 32 | 88 | 156 | 99.49 |
| 1 | SLACK_ONLY | 24 | 66 | 755 | 99.49 |
| 1 | CYCL_ONLY | 24 | 66 | 818 | 99.49 |
| 1 | ALL | 24 | 66 | 835 | 99.49 |
| 1 | NONE | 26 | 72 | 728 | 99.49 |
| 2 | SLACK_ONLY | 16 | 38 | 2944 | 75.5 |
| 2 | CYCL_ONLY | 16 | 38 | 3001 | 75.6 |
| 2 | ALL | 16 | 38 | 3018 | 75.4 |
| 2 | NONE | 20 | 50 | 2940 | 75.4 |

Table 4 shows the results for a circuit containing only self-loops (a "mult" circuit). Since these circuits require all flip-flops to be converted, the particular methodology employed is irrelevant. Note, however, that the results depicted in Table 4 indicate that for such circuits adequate fault coverage may be obtained without breaking any of the loops. Thus, based upon the results depicted in Table 4, modification of these circuits is not required, thereby resulting in a savings in silicon area and component overhead.

TABLE 4

Results for circuit 4 (mult)

| Heuristic* | #FFs selected | # Violations | # BIST Vectors | BIST Coverage |
|---|---|---|---|---|
| FullScan | 16 | 3 | 878 | 98.58 |
| All Cycles' | 0 | 0 | 1024 | 98.56 |
| All Cycles | 16 | 3 | 878 | 98.58 |
| Cycle-1 | 0 | 0 | 1024 | 98.56 |
| Cycle-2 | 0 | 0 | 1024 | 98.56 |

In all situations the number of automatic test pattern generated (ATPG) vectors required for comparable fault coverage was found to be between ⅕ and ½ of the number of BIST vectors. Although the number of BIST vectors is more than ATPG vectors, application of BIST vectors is at system clock speed. Thus, the BIST test time is significantly lower than for traditional scan-based test. Further, the external control overhead is lower since only one additional clock control pin is required to apply BIST vectors. Furthermore, application of consecutive patterns at the circuit's normal clock speed can partially cover additional faults such as delay and other performance related faults.

What is claimed is:

1. In a BIST architecture for testing a digital system, a method for selecting ones of a plurality of storage elements contained in said digital system which are suitable to be converted into respective BIST elements so as to minimize the effect of said conversion upon the performance of said digital system, each of said storage elements having associated therewith an in-slack, an out-slack, an in-delay, and an out-delay, said method comprising the steps of:

(a) choosing as a reference element one of said plurality of storage elements;

(b) identifying those ones of said plurality of storage elements which have an edge to said reference element as origin elements;

(c) determining, based upon said out-delays of said origin elements and said in-delay and in-slack of said reference element, a new in-slack of said reference element;

(d) comparing said new in-slack of said reference element with a predetermined in-slack threshold value;

(e) identifying those ones of said plurality of storage elements which have an edge originating at said reference element as termination elements;

(f) determining, based upon said in-delays of said termination elements and said out-delay and out-slack of said reference element, a new out-slack of said reference element;

(g) comparing said new out-slack of said reference element with a predetermined out-slack threshold value;

(h) identifying, in response to said steps of comparing, said reference element as being suitable for conversion to one of said respective BIST elements; and (i) repeating steps (a) through (h) for each of said plurality of storage elements.

2. The method of claim 1 wherein step (c) comprises the steps of:

(c1) identifying ones of said origin elements which have been previously selected for conversion to one of said respective BIST elements;

(c2) identifying the maximum of said out-delays of said ones of said origin elements which have been previously selected for conversion to one of said respective BIST elements; and (c3) determining a new in-slack of said reference element, wherein said new in-slack equals said in-slack of said reference element minus the sum of said maximum of said out-delays and said in-delay of said reference element.

3. The method of claim 1 wherein step (f) comprises the steps of:

(f1) identifying ones of said termination elements which have been previously selected for conversion to one of said respective BIST elements;

(f2) identifying the maximum of said in-delays of said ones of said termination elements which have been previously selected for conversion to one of said respective BIST elements; and (f3) determining a new out-slack of said reference element, wherein said new out-slack equals said out-slack of said reference element minus the sum of said maximum of said in-delays and said out-delay of said reference element.

4. In a BIST architecture for testing a digital system comprising a plurality of storage elements, determining whether a selected one of said plurality of storage elements may be converted to a BIST element without causing any timing violations in said system, said method comprising the steps of:

(a) identifying ones of said plurality of storage elements which have an edge to said selected one as origin elements, each of said origin elements having associated therewith a respective out-delay;

(b) determining the in-delay, out-delay, in-slack, and out-slack of said selected one;

(c) determining, based upon said out-delays of said origin elements and said in-delay and in-slack of said selected one, a new in-slack of said selected one;

(d) identifying ones of said plurality of storage elements which have an edge originating at said selected one as termination elements, each of said termination elements having associated therewith a respective in-delay;

(e) determining, based upon said in-delays of said termination elements and said out-delay and out-slack of said selected one, a new out-slack of said selected one;

(f) comparing said new in-slack of said selected one with a predetermined in-slack threshold value;

(g) comparing said new out-slack of said selected one with a predetermined out-slack threshold value; and (h) identifying, in response to said steps of comparing, said selected one as being suitable for conversion to said BIST element.

5. The method of claim 4 wherein step (c) comprises the steps of:

(c1) identifying each of said origin elements which has been previously selected for conversion to said BIST element;

(c2) identifying the maximum of said out-delays of said origin elements identified in step (b); and (c3) determining a new in-slack of said selected one, wherein said new in-slack equals said in-slack of said selected one minus the sum of said maximum of said out-delays and said in-delay of said selected one.

6. The method of claim 4 wherein step (e) comprises the steps of:

(e1) identifying each of said termination elements which has been previously selected for conversion to said BIST element;

(e2) identifying the maximum of said in-delays of said termination elements identified in step (e1); and (f3) determining a new out-slack of said selected one, wherein said new out-slack equals said out-slack of said selected one minus the sum of said maximum of said in-delays and said out-delay of said selected one.

* * * * *

UNITED STATES PATENT AND TRADEMARK OFFICE
CERTIFICATE OF CORRECTION

PATENT NO.   :   5,596,585
DATED        :   Jan. 21, 1997
INVENTOR(S)  :   Njinda, Charles A.; Kaul, Neeraj It is certified that error appears in the above-identified patent and that said Letters Patent is hereby corrected as shown below:

At column 12, line 39, delete "(f3)" and insert --(e3)--.

Signed and Sealed this

Twelfth Day of August, 1997

*Attest:*

BRUCE LEHMAN

*Attesting Officer*   *Commissioner of Patents and Trademarks*